United States Patent [19]

Wolf et al.

[11] 4,038,512

[45] July 26, 1977

[54] SELF-STABILIZING ARC HEATER

[75] Inventors: Charles B. Wolf, Irwin; Maurice G. Fey, Plum Borough; Frederick A. Azinger, Jr., Churchill Borough, all of Pa.

[73] Assignee: Westinghouse Electric Corporation, Pittsburgh, Pa.

[21] Appl. No.: 603,575

[22] Filed: Aug. 11, 1975

[51] Int. Cl.² .............................................. B23K 9/00
[52] U.S. Cl. .................................. 219/121 P; 219/74; 219/75
[58] Field of Search ................. 219/74, 75, 76, 121 P, 219/383

[56] References Cited

U.S. PATENT DOCUMENTS

| 3,465,115 | 9/1969 | Hirt et al. | 219/75 |
| 3,521,106 | 7/1970 | Hess | 219/121 P X |
| 3,591,759 | 7/1971 | Stand | 219/121 P X |
| 3,705,975 | 12/1972 | Wolf et al. | 219/383 |
| 3,770,935 | 11/1973 | Tateno et al. | 219/121 P |
| 3,953,705 | 4/1976 | Painter | 219/383 X |

Primary Examiner—Bruce A. Reynolds
Assistant Examiner—N. D. Herkamp
Attorney, Agent, or Firm—L. P. Johns

[57] ABSTRACT

The arc heater of this invention is characterized by a pair of axially spaced substantially cylindrical electrodes which form a narrow gap between adjacent ends thereof. The gap communicates between a peripheral plenum chamber and the arc chamber formed by the electrodes, and the gap is included inwardly and downwardly toward the outlet end of the arc chamber in order to prevent solid particles from entering and clogging the gap as the particles travel through the arc chamber. The arc heater also includes a third cylindrical electrode disposed at the inlet end of the arc chamber.

7 Claims, 3 Drawing Figures

SELF-STABILIZING ARC HEATER

BACKGROUND OF THE INVENTION

1. Field of the Invention:

This invention relates to arc heaters and more particularly it pertains to a specific gap construction.

2. Description of the Prior Art:

Self stabilizing arc heaters usually comprise two cylindrical, axially aligned electrodes having a small axial gap therebetween. An electric arc energized from a convenient external source of electrical power is struck in the gap between the cylindrical electrodes. Gas is introduced through the gap and any solid material is introduced at another inlet location and passed through the arc chamber and the outlet end thereof under the pressure of the jet gas developed in the arc chamber. A problem incurred with radially disposed annular gaps has been the undesired entrance of solid particles into the gap as the particles move through the arc chamber. Such particles usually accumulate in certain zones of the gap, causing erosion of the materials of construction and in addition adversely affecting the electrical breakdown of the gap, thereby reducing the overall efficiency of the arc heater.

Associated with the foregoing has been a problem of adherence of solid particles to the inner surface of the cylindrical electrode, resulting in reduced efficiency and product yield.

SUMMARY OF THE INVENTION

In accordance with this invention, it has been found that the foregoing problems may be overcome by providing an electric arc heater which comprises a pair of cylindrical electrodes separated axially by a gap which is disposed between spaced ends of the electrodes, the cylindrical electrodes form an arc chamber having an inlet end and outlet end, the electrodes comprising spaced end walls forming a gap and being inclined at an angle to the longitudinal axis of the chamber and extending downwardly toward the outlet end thereof. The arc heater also comprises a third cylindrical electrode disposed upstream of the gap and having a diameter less than that of other electrodes.

The advantage of the arc heater structure of this invention is that the downwardly inclined gap between the cylindrical electrodes avoids problems inherent in arc heaters of prior construction in that solid particles of matter do not enter the gap as they travel through the arc chamber.

DESCRIPTION OF THE PREFERRED EMBODIMENTS

Inasmuch as a detailed description of the structure in operation of an arc heater is set forth in U.S. Pat. No. 3,832,519, entitled "Arc Heater with Integral Fluid and Electrical Ducting and Quick Disconnect Facility", inventors Charles D. Wolf, Maurice G. Fey, and Frederick A. Azinger, Jr., the description of the arc heater 9 is limited to a structure that is essential to the operation of this invention.

Figure 1:
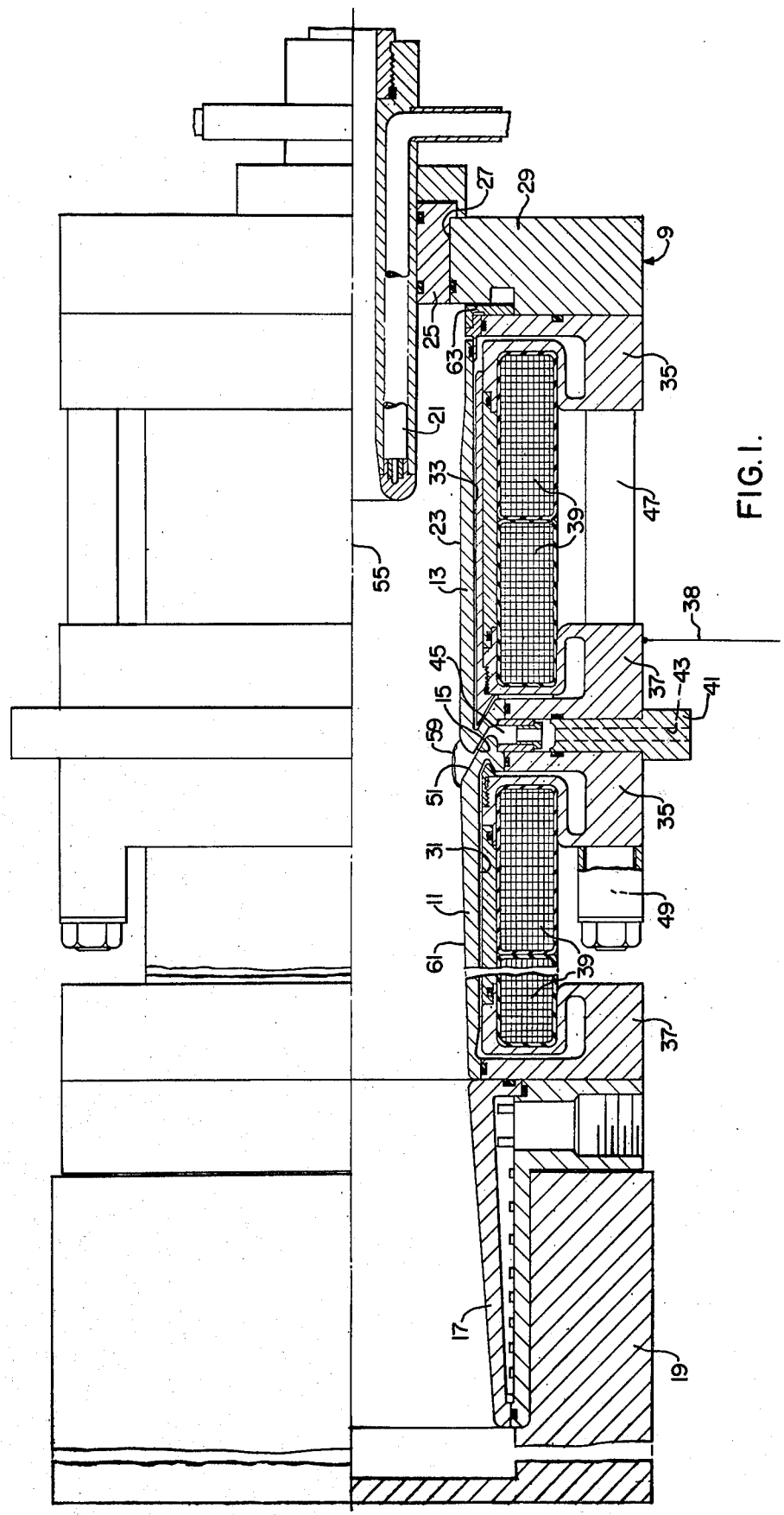
FIG. 1 is a longitudinal sectional view partly in elevation through an arc heater of this invention.

In FIG. 1 an arc heater is generally indicated at 9. The arc heater 9 comprises a downstream electrode 11, an upstream electrode 13, and a space or gap 15 disposed between adjacent ends of the electrodes. An adapter or outlet 17 is provided at the left end of the downstream electrode 11, as viewed in FIG. 1, which outlet communicates with a reaction vessel 19 in which solid reaction products are accumulated.

At the upstream end of the arc heater 9 a feed tube 21 is provided preferably in an axial alignment with an arc chamber 23 formed by electrodes 11 and 13. The feed tube 21 directs feed material, such as metal oxide or ore into the arc heater. A bushing 25 is mounted within an opening 27 in an end closure 29 of the arc chamber 23. The electrodes 11 and 13 comprise water cooling jacket means 31 and 33, respectively, which include similar inlet and outlet manifolds 35, 37. Similar field coils 39 are disposed around each electrode 11, 13. Field coils 39 preferably operate on direct current, but may be used with alternating current.

An insulating plate 41 is disposed between the manifold flanges 35, 37 and the plate is preferably provided with a suitable inlet means such as a passage 43 by which a gas, such as air, steam, or methane ($CH_4$), is introduced into a plenum chamber 45 which communicates with the gap 15.

Suitable means for retaining the assembly of the foregoing parts, such as spaced tie rods and bolts 49, are provided for holding the assembly together. The electrical circuit through the arc heater 9 extends from a lead of an AC source through the manifold flange 35, the electrode 11, the arc 59, the electrode 13, the manifold flange 37, and the AC lead 38.

In accordance with this invention, spaced end walls or surfaces 51 and 53 of the electrodes 11 and 13, respectively, are disposed in spaced relation to form the gap 15. The surfaces 51, 53 are inclined at an angle to the longitudinal axis 55 of the arc chamber 23 so that the gap 15 extends inwardly and downwardly toward the downstream end of the chamber, in order to minimize or eliminate any accumulation of solid material particles in the gap 15. The angle of inclination of the gap 15 with respect to the longitudinal axis 55 or the cylindrical wall of the chamber 23 is preferably 30°, however, angles of greater or less inclination are operable. The angle of inclination is dependent upon consideration of two primary factors including prevention of the deposits, and the flow direction of the gas from the gap 15 into the chamber 23 and its influence upon an arc 59 extending between the electrodes 11, 13. Inasmuch as the gap 15 is circumferentially coextensive with the electrodes 11, 13, the gap has the shape of a truncated cone.

Likewise in accordance with this invention the downstream electrode 11 is tapered; that is, the inner surface 61 forming the downstream end portion of the chamber 23 has a greater diameter than the upstream end portion of the electrode 11. The tapered inner surface 61 of the electrode 11 prevents or minimizes a build up of solid particles on the electrode surface which build up ordinarily occurs where the surface is cylindrical. As solid particles build up on the electrode surface, the force of a normally vibrating gas jet in the arc chamber tends to dislodge the build up which can break free from the tapered surface and be discharged by the gas stream from the arc heater. Thus, the tapered electrode surface prevents a reduction of efficiency of operation of the arc heater which would result from the major accumulation of deposits.

Finally, in addition to the gap 15 gas may be introduced through peripherally spaced inlets 63. Manifestly, the gases entering the chamber 23 are directed to the left, as viewed in FIG. 1, and move into the influence of the rotating arc 59.

Figure 2:
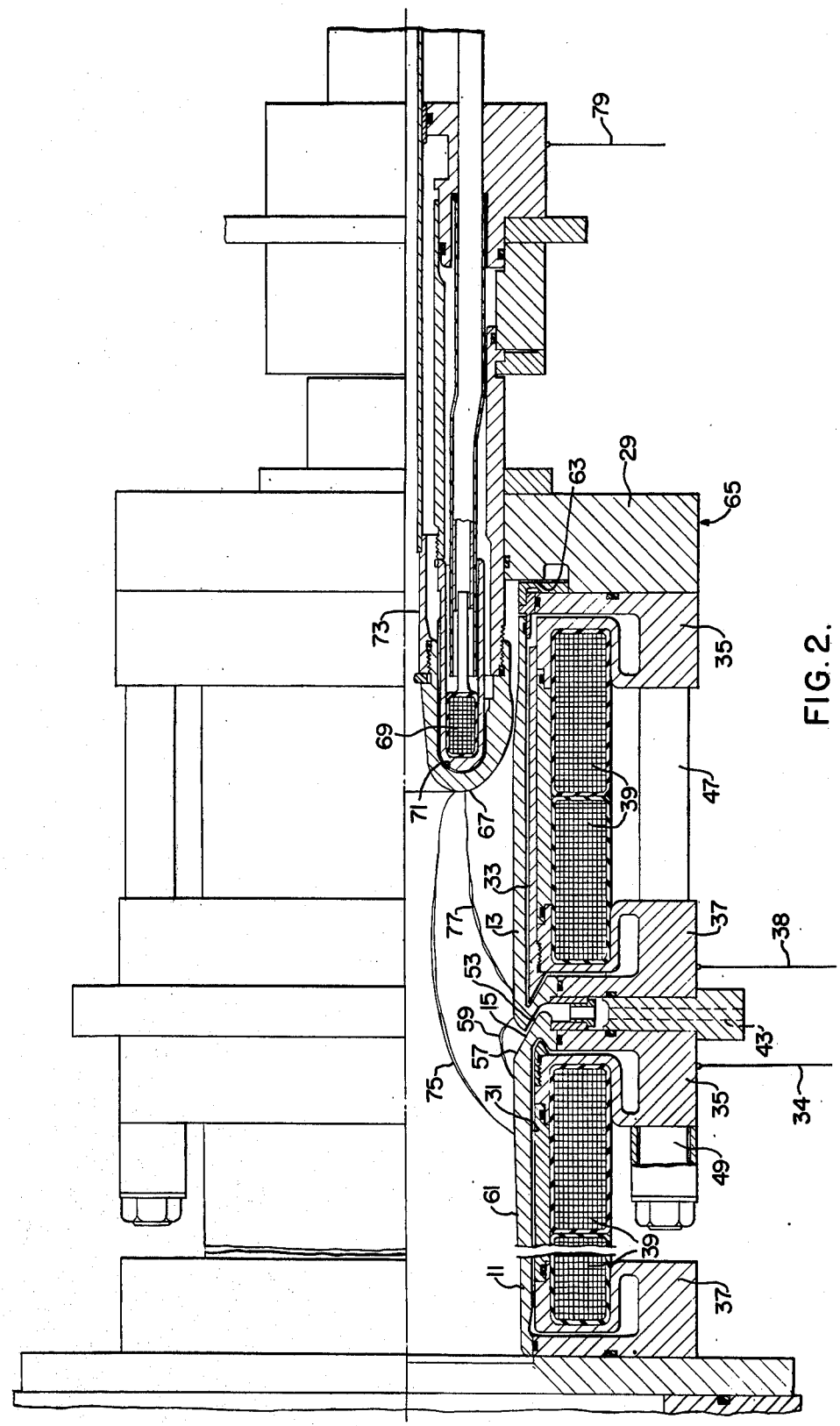
FIGS. 2 and 3 are similar views of other embodiments of the invention.

Another embodiment of the invention is shown in FIG. 2 in which a three-phase arc heater 65 is shown. Inasmuch as the arc heater is substantially similar to the single phase arc heater 9 of FIG. 1, for brevity, all of the corresponding parts are identified with similar reference numbers. The arc heaters 65 comprises a third cylindrical electrode 67 together with a cylindrical field coil 69 enclosed therein. The electrode 67 fits telescopically within the upstream electrode 13. Like the electrodes 11 and 13, the electrode 67 includes water coolant means including a conduit 71 which communicates with inlet and outlet conduits in a conventional manner.

In operation, when necessary a particulated solid feed material, such as metal oxide or ore, is introduced into the arc heater 65 through a bore 73 of the cylindrical electrode 67. Gases, such as air, steam or methane, are introduced through the gap 15 as well as the inlet 63, which gases together with the feed material come into the influence of the arcs 59, 75, and 77. The arc 59 extends between the electrodes 11, 13, the arc 75 extends between the electrodes 11, 67, and the arc 77 extends between the electrodes 13, 67, as a result of the three-phase circuit established between them.

The arc heater 65, being provided with AC leads 34, 38, and 79 induces a typical three-phase electrical circuit extending from the leads, their respective electrodes, and between them through the arc 59, 75, and 77 as shown in FIG. 2. The advantage of the three-phase embodiment of FIG. 2 is that a more uniform temperature is provided within the arc chamber than in the single phase embodiment of FIG. 1. As a result, a higher yield is achieved for a given steady feed rate of particulated solid.

Figure 3:
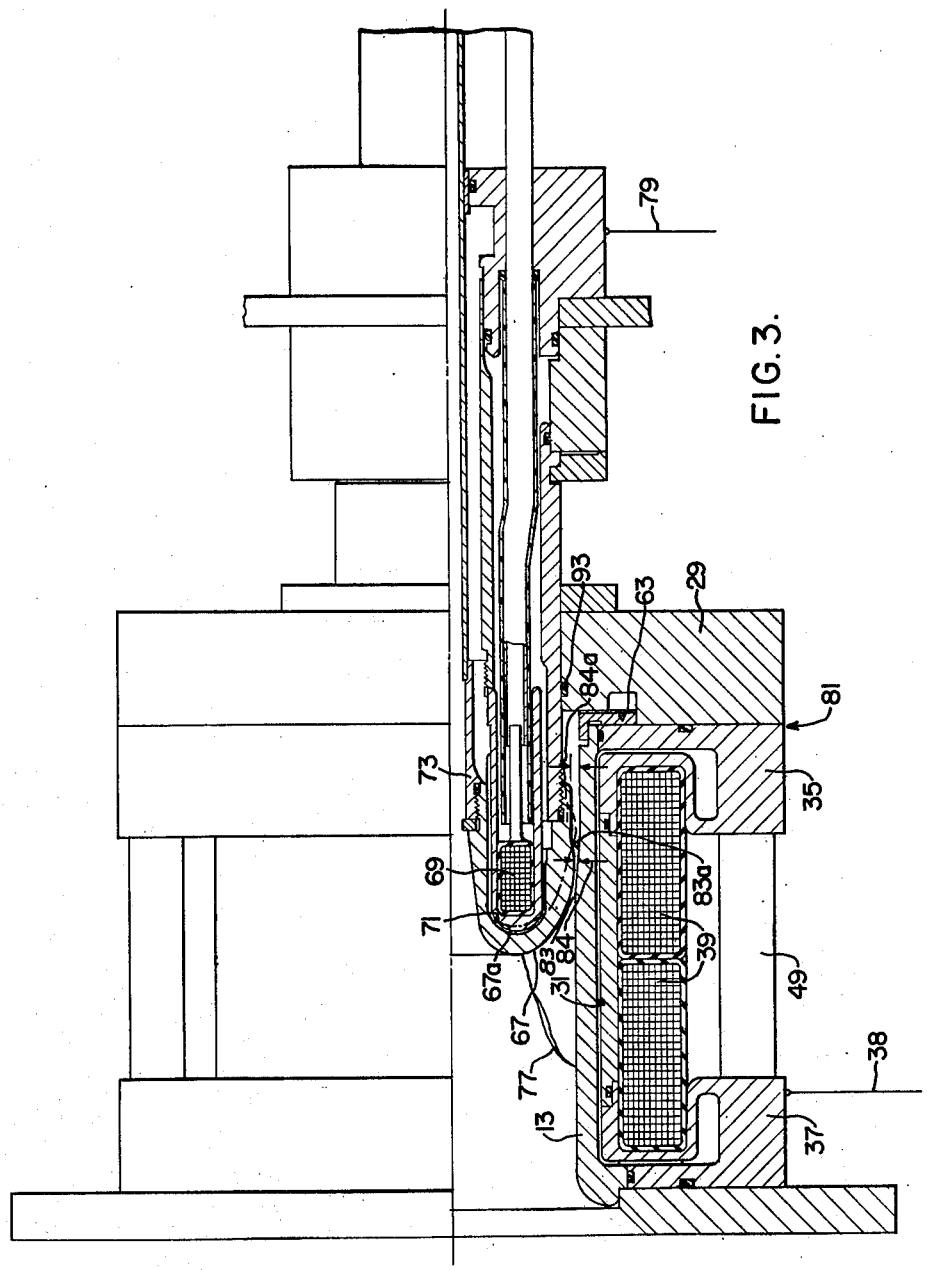

Another embodiment of the invention is that shown in FIG. 3 in which similar reference numbers are provided for parts that are similar to the embodiment of FIGS. 1 and 2. The arc heater 81 of FIG. 3 is a single phase unit operable on either AC or DC current. The arc heater 81 includes only the electrodes 13 and 67 so that with the electrode 11 omitted the gap 15 existing in the embodiments of FIGS. 1 and 2 is non-existent for the arc heater 81. However, a space or gap 83 extending from the gas inlet 63 to the arcing area within the electrode 13 is provided. The gap 83 is like the gap 15 of the embodiments of FIGS. 1 and 2 in that the gap 83 extends downstream toward the outlet end of the arc heater so that solid particles introduced through the bore 73 of the electrode 67 are inhibited from entering and contaminating the gap. An electric circuit extends from the lead 38 through the manifold flange 37, the electrode 13, the arc 77, the electrode 67, and to the lead 79.

As shown in FIG. 3 the inner surface of the electrode 13 is tapered at 83a. The electrode 67 is movable between the position shown and a dotted line position 67a along the tapered surface 83a to vary the size of the gap 83 from about 20 to 60 mils as indicated by the arrows 84 and 84a, respectively. Thus, the gap size is adjustable from a larger dimension when used with a gas, such as argon, having a lower dielectric constant to a smaller dimension with a gas, such as hydrogen, having a higher dielectric constant. Moreover, a smaller gap is used when a gas is under a higher pressure. To provide for the axial movement of the electrode 67 to adjust the gap dimension on tapered surface 83a, sealing means, such as an O-ring 93, are provided between the end enclosure 29 and the shaft of the electrode.

Accordingly, the device of the present invention provides a self-stabilizing arc heater in which a problem of contamination of the arc gap as well as the arc chamber is avoided by the particular configuration of parts as set forth herein.

What is claimed is:

1. An arc heater for processing particulate material comprising at least two axially spaced, substantially cylindrical electrodes forming a narrow gap therebetween and adapted to be connected to a source of potential to produce an arc in the gap, means spacing and electrically insulating the electrodes from each other and comprising means for channeling gas to be heated at a high velocity to the gap, the cylindrical electrodes forming the gap also defining an arc chamber extending in opposite directions from the gap and having an inlet end and an outlet end, the cylindrical electrodes comprising spaced wall surfaces forming the gap and being inclined at an angle to the longitudinal axis of the chamber and extending downwardly toward the outlet end thereof, whereby solid particles moving through the chamber toward the outlet end do not collect in the gap.

2. The arc heater of claim 1 in which the gap extends between an outer plenum compartment and the arc chamber.

3. The arc heater of claim 1 in which the cylindrical electrodes comprise end walls spaced from each other to form the narrow gap, and the end walls extending inwardly and downwardly toward the outlet end of the chamber.

4. The arc heater of claim 1 in which the narrow gap has the shape of a truncated cone.

5. The arc heater of claim 1 in which the inner surface of the electrode adjacent to the outlet is tapered radially outwardly from the gap to the outlet end.

6. The arc heater of claim 1 in which a third electrode is disposed upstream of the narrow gap.

7. The arc heater of claim 6 in which the third electrode is cylindrical and of a diameter less than that of the other electrodes.

* * * * *